(12) United States Patent
Taketomi et al.

(10) Patent No.: US 10,624,216 B2
(45) Date of Patent: Apr. 14, 2020

(54) WIRING BOARD, ELECTRONIC APPARATUS, METHOD FOR ATTACHING SHEET METAL COVERS, AND METHOD FOR MANUFACTURING WIRING BOARD

(71) Applicant: FUJITSU LIMITED, Kawasaki-shi, Kanagawa (JP)

(72) Inventors: Nobuo Taketomi, Kodaira (JP); Takahiro Kitagawa, Kawasaki (JP); Mitsunori Abe, Kawasaki (JP); Shigeru Sugino, Edogawa (JP); Kiyoyuki Hatanaka, Kawasaki (JP); Shigeo Iriguchi, Kawasaki (JP); Ryo Kanai, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/150,777

(22) Filed: Oct. 3, 2018

(65) Prior Publication Data
US 2019/0110365 A1    Apr. 11, 2019

(30) Foreign Application Priority Data

Oct. 6, 2017    (JP) .................................. 2017-196037

(51) Int. Cl.
```
H05K 3/34      (2006.01)
H01L 23/492    (2006.01)
H05K 1/02      (2006.01)
H05K 3/40      (2006.01)
H05K 3/00      (2006.01)
```

(52) U.S. Cl.
CPC ........... *H05K 3/341* (2013.01); *H01L 23/492* (2013.01); *H05K 1/0296* (2013.01); *H05K 3/403* (2013.01); *H05K 3/0052* (2013.01); *H05K 3/3405* (2013.01); *H05K 2201/09145* (2013.01); *H05K 2201/09181* (2013.01); *H05K 2201/09909* (2013.01); *H05K 2201/10371* (2013.01); *H05K 2203/013* (2013.01)

(58) Field of Classification Search
CPC ......... H05K 2201/09181; H05K 3/403; H05K 3/341; H05K 1/0296; H05K 3/0052; H05K 2203/013; H05K 2202/09145; H05K 2201/09909; H01L 23/492
See application file for complete search history.

(56) References Cited

U.S. PATENT DOCUMENTS

| | | | | |
|---|---|---|---|---|
| 2003/0117784 A1* | 6/2003 | Fukunabe | ............ | H05K 3/3442 361/760 |
| 2017/0265297 A1* | 9/2017 | Onishi | ................. | H05K 1/0268 |

FOREIGN PATENT DOCUMENTS

JP    2013-179157    9/2013

* cited by examiner

*Primary Examiner* — Jasmine J Clark
(74) *Attorney, Agent, or Firm* — Fujitsu Patent Center

(57) ABSTRACT

A wiring board includes, a base plate that has a first surface, a second surface opposite to the first surface, and a side surface coupled to the first surface and the second surface, a conductor provided on the side surface, and a protrusion provided over the side surface. The protrusion partitions the conductor into a first portion on the side surface that extends to the first surface and a second portion on the side surface that extends to the second surface. The protrusion has a solder wettability lower than the conductor and protrudes from the conductor.

13 Claims, 24 Drawing Sheets

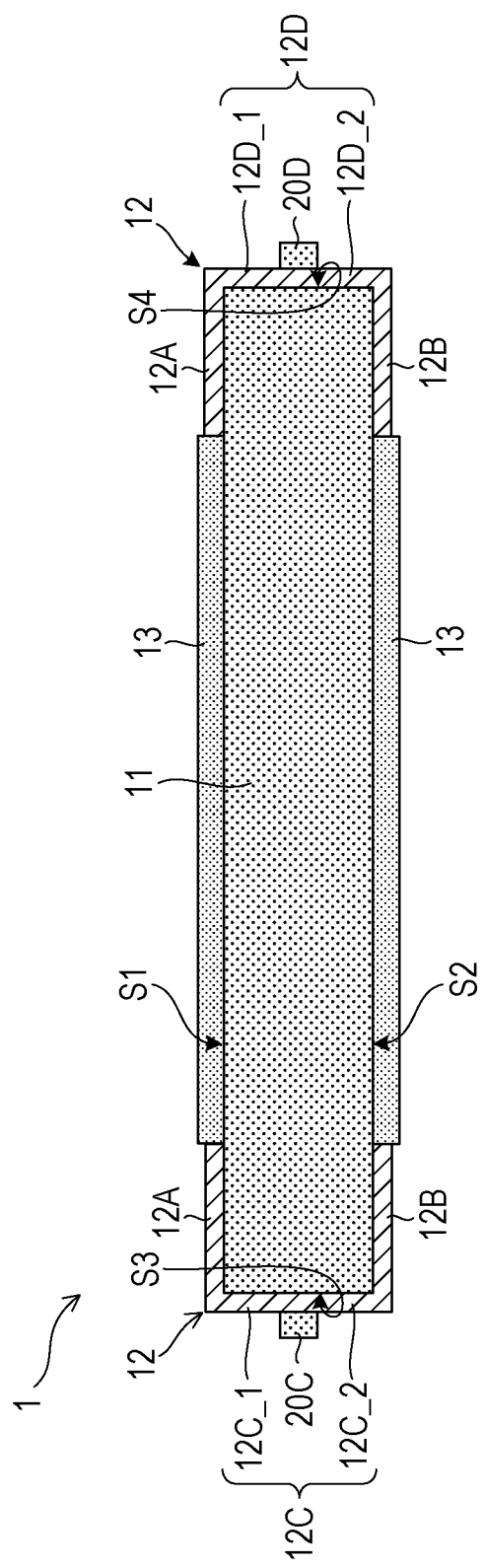

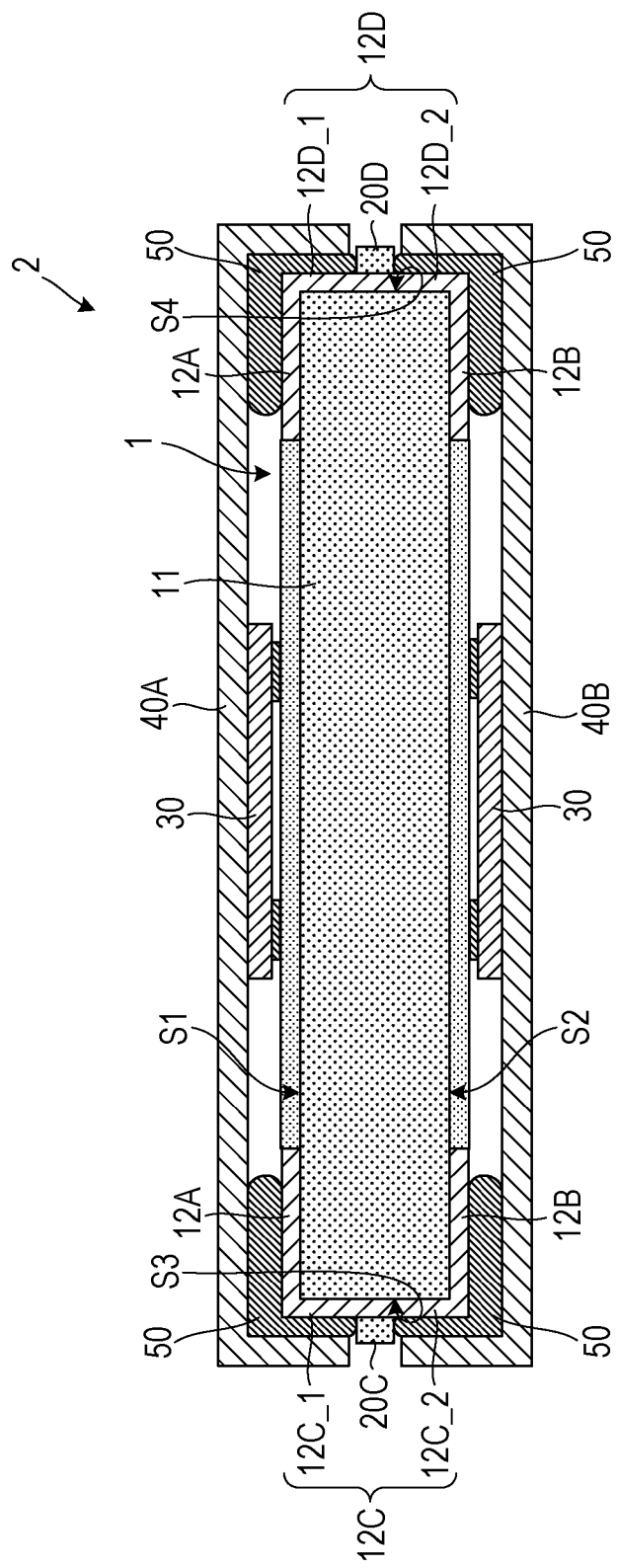

WIRING BOARD, ELECTRONIC APPARATUS, METHOD FOR ATTACHING SHEET METAL COVERS, AND METHOD FOR MANUFACTURING WIRING BOARD

CROSS-REFERENCE TO RELATED APPLICATION

This application is based upon and claims the benefit of priority of the prior Japanese Patent Application No. 2017-196037, filed on Oct. 6, 2017, the entire contents of which are incorporated herein by reference.

FIELD

The embodiment discussed herein is related to a wiring board, an electronic apparatus, method for attaching sheet metal covers, and a method for manufacturing a wiring board.

BACKGROUND

The following is known as a technique related to a wiring board including electrodes for soldering parts to a side surface of the base plate. For example, there is known a printed wiring board in which multiple side-surface electrodes, to which electronic components are to be soldered, are provided in notches formed in the side surface of the base plate. The side-surface electrodes, each having a relatively high portion and a relatively low portion, are divided by dividers formed of the base plate or solder resist.

A related technique is disclosed in Japanese Laid-open Patent Publication No. 2013-179157.

SUMMARY

According to an aspect of the embodiments, a wiring board includes, a base plate that has a first surface, a second surface opposite to the first surface, and a side surface coupled to the first surface and the second surface, a conductor provided on the side surface, and a protrusion provided over the side surface. The protrusion partitions the conductor into a first portion on the side surface that extends to the first surface and a second portion on the side surface that extends to the second surface. The protrusion has a solder wettability lower than the conductor and protrudes from the conductor.

The object and advantages of the invention will be realized and attained by means of the elements and combinations particularly pointed out in the claims. It is to be understood that both the foregoing general description and the following detailed description are exemplary and explanatory and are not restrictive of the invention.

BRIEF DESCRIPTION OF DRAWINGS

FIG. 1B is a cross-sectional view taken along line IB-IB in FIG. 1A;

FIG. 6B is a cross-sectional view taken along line VIB-VIB in FIG. 6A;

DESCRIPTION OF EMBODIMENTS

Figure 1A:
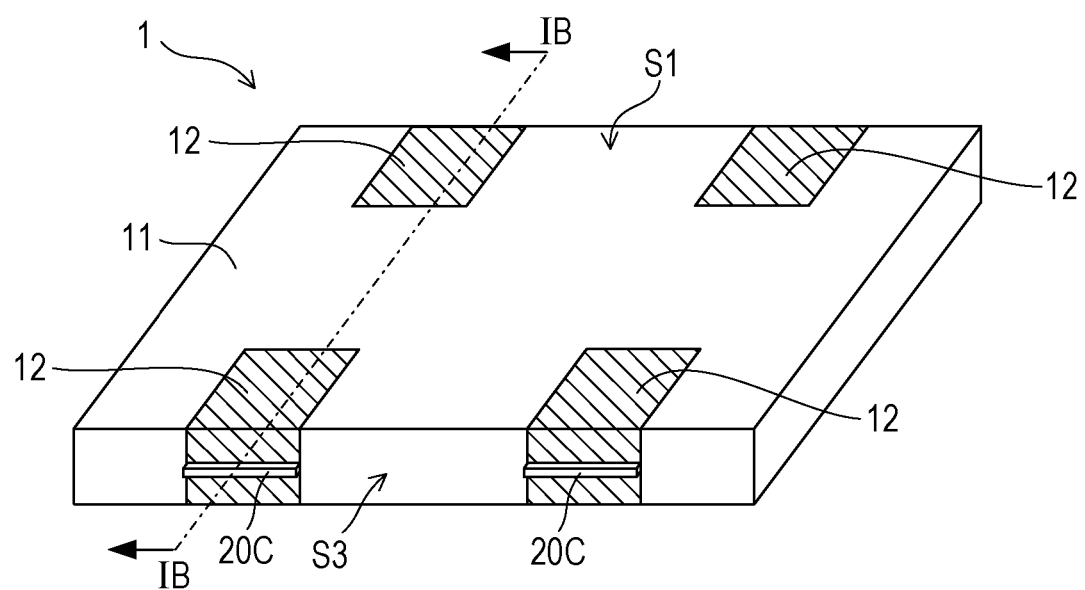
FIG. 1A is a perspective view of the structure of a wiring board according to an embodiment of the disclosed technique.

A wireless communication terminal such as a mobile phone and a smartphone has a structure to avoid malfunction due to external electromagnetic waves and interference of electromagnetic waves generated by itself with radio waves for communication. For example, a wiring board on which electronic components for wireless communication are mounted is covered with shielding sheet metals coupled to a fixed potential. To enhance the effect of shielding electromagnetic waves by the shielding sheet metals, it is preferable that not only the first surface, which is the main surface of the wiring board and the second surface opposite to the first surface, but also the side surfaces of the wiring board be covered with the shielding sheet metals. In this case, a first shielding sheet metal having bent portions formed according to the shape and dimensions of the wiring board covers the first surface and some of the side surfaces of the wiring board, and a second shielding sheet metal having bent portions formed in the same manner covers the second surface and the other some of the side surfaces of the wiring board. The first shielding sheet metal is soldered to a conductor (electrode) provided on a side surface of the wiring board, and then the second shielding sheet metal is soldered to a conductor (electrode) provided on a side surface of the wiring board.

The solder used for attaching the first shielding sheet metal may be wetting and spread to a portion of the wiring board to which the second shielding sheet metal is to be attached. In this case, the wiring board to be covered with the second shielding sheet metal may have interference with the solder used for attaching the first shielding sheet metal, and this may make it difficult to attach the second shielding sheet metal to the wiring board.

Hereinafter, examples of embodiments of the present disclosure will be described with reference to the drawings. The same or equivalent constituents and parts are denoted by the same reference numerals in each drawing, and repetitive explanation is omitted as appropriate.

First Embodiment

FIG. 1A is a perspective view of the structure of a wiring board 1 according to an embodiment of the disclosed technique, and FIG. 1B is a cross-sectional view taken along line IB-IB in FIG. 1A.

The wiring board 1 includes a base plate 11 composed of an insulator, such as glass epoxy resin. The base plate 11 has a first surface S1, a second surface S2 opposite to the first surface S1, and side surfaces S3 and S4 coupled to the first surface S1 and the second surface S2. The wiring board 1 has conductors 12 provided at multiple positions on the base plate 11. Each conductor 12 is used for attaching shielding sheet metals described later to the wiring board 1. Each conductor 12 is coupled to a fixed potential, such as the ground potential. In each figure, illustration of the shape of traces for connecting the conductors 12 to the fixed potential is omitted. Each conductor 12 provided along the side surface S3 of the base plate 11 has a conductor portion 12A extending on the first surface S1 of the base plate 11, a conductor portion 12B extending on the second surface S2, and a conductor portion 12C extending on the side surface S3 of the base plate 11 and coupled to the conductor portions 12A and 12B. Each conductor 12 provided along the side surface S4 of the base plate 11 has a conductor portion 12A extending on the first surface S1 of the base plate 11, a conductor portion 12B extending on the second surface S2, and a conductor portion 12D extending on the side surface S4 of the base plate 11 and coupled to the conductor portions 12A and 12B. The wiring board 1 may include wiring patterns (not illustrated) electrically coupled to electronic components mounted on the wiring board 1 on the first surface S1, second surface S2, and inner layers of the base plate 11.

On the surface of the conductor portion 12C extending on the side surface S3 of the base plate 11 is provided a protrusion 20C protruding from the surface of the conductor portion 12C at an intermediate position between the first surface S1 and second surface S2 of the base plate 11. The protrusion 20C partitions the conductor portion 12C into a portion 12C_1 extending on the first surface S1 side of the base plate 11 and a portion 12C_2 extending on the second surface S2 side of the base plate 11.

In the same manner, on the surface of the conductor portion 12D extending on the side surface S4 of the base plate 11 is provided a protrusion 20D protruding from the surface of the conductor portion 12D at an intermediate position between the first surface S1 and second surface S2 of the base plate 11. The protrusion 20D partitions the conductor portion 12D into a portion 12D_1 extending on the first surface S1 side of the base plate 11 and a portion 12D_2 extending on the second surface S2 side of the base plate 11.

Figure 2:
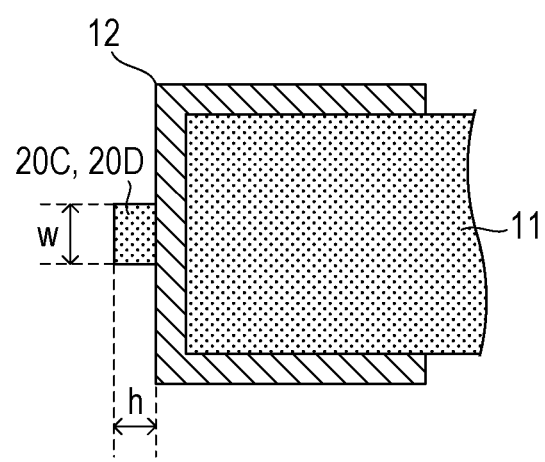
FIG. 2 is a partial cross-sectional view of the wiring board according to the embodiment of the disclosed technique.

The protrusions 20C and 20D are made of a material having a solder wettability lower than the conductors 12. The protrusions 20C and 20D may be made of, for example, resin material, and resin materials that may be used include solder resist ink and plastic ink used for drawing letters, symbols, marks, and the like on the wiring board 1. The height h (see FIG. 2) of the protrusions 20C and 20D is, for example, approximately 20 μm to 30 μm, and the width w (the length in the thickness direction of the base plate 11, see FIG. 2) of the protrusions 20C and 20D is, for example, approximately 40 μm to 100 μm.

The first surface S1 and second surface S2 of the base plate 11 are covered with solder resist 13.

FIGS. 3A, 3B, 3C, 3D, 3E and 3F are plan views of an example of a method of producing the wiring board 1. FIGS. 4A, 4B, 4C, 4D, 4E, and 4F are cross-sectional views respectively taken along lines IVA-IVA, IVB-IVB, IVC-IVC, IVD-IVD, IVE-IVE, and IVF-IVF in FIGS. 3A to 3F.

Figure 3A:
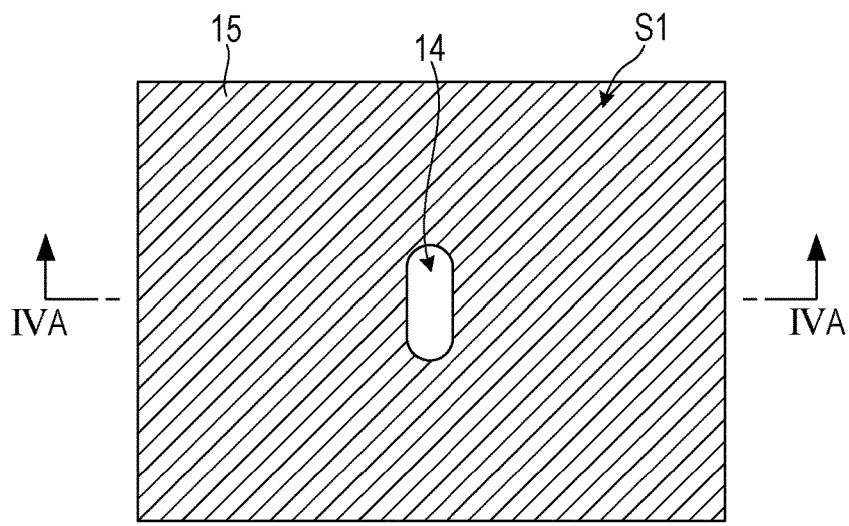
FIG. 3A is a plan view of an example of a method of producing the wiring board according to the embodiment of the disclosed technique.
Figure 4A:
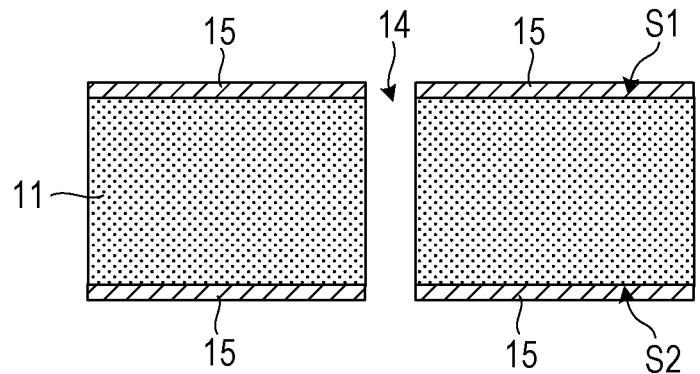
FIG. 4A is a cross-sectional view taken along line IVA-IVA in FIG. 3A.

First, copper foil 15 is attached to the first surface S1 and second surface S2 of the base plate 11 composed of an insulator, such as glass epoxy resin, and a through hole 14 is formed to pass through the portion between the first surface S1 and the second surface S2 (FIGS. 3A and 4A).

Figure 3B:
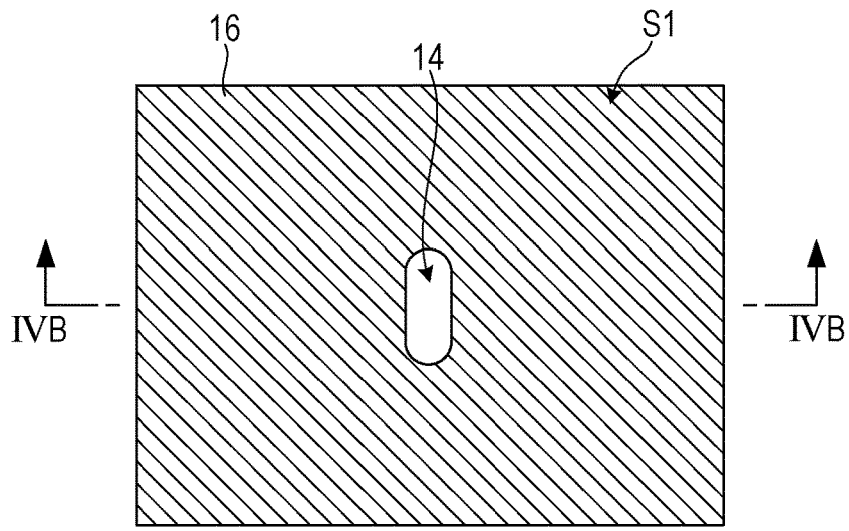
FIG. 3B is a plan view of the example of the method of producing the wiring board according to the embodiment of the disclosed technique.
Figure 4B:
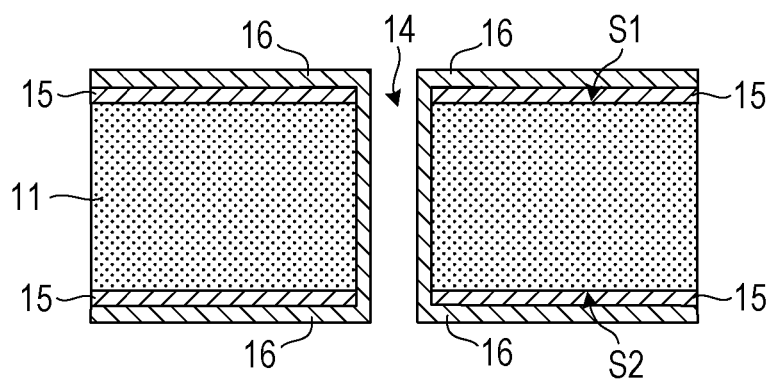
FIG. 4B is a cross-sectional view taken along line IVB-IVB in FIG. 3B.

Next, plating film 16 is formed on the surfaces of the copper foil 15 and the inner walls of the through hole 14, using a plating method. The material of the plating film 16 may be copper (FIGS. 3B and 4B).

Figure 3C:
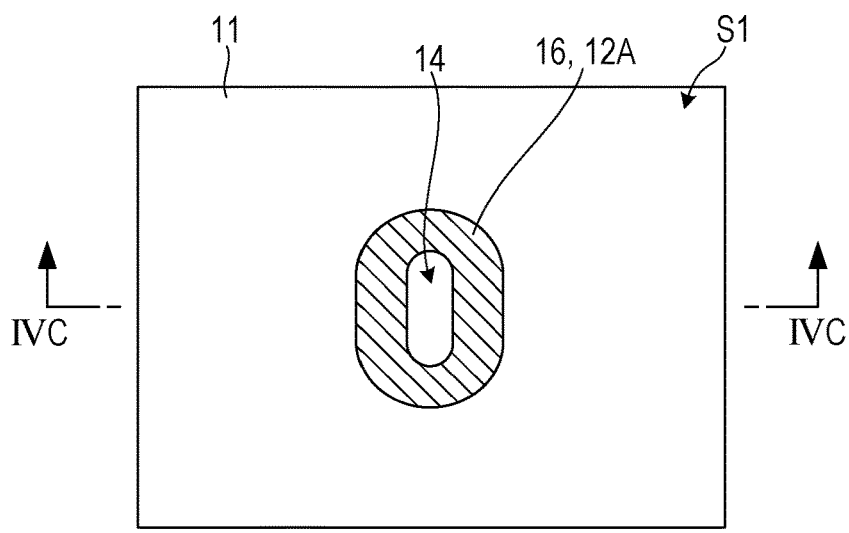
FIG. 3C is a plan view of the example of the method of producing the wiring board according to the embodiment of the disclosed technique.
Figure 4C:
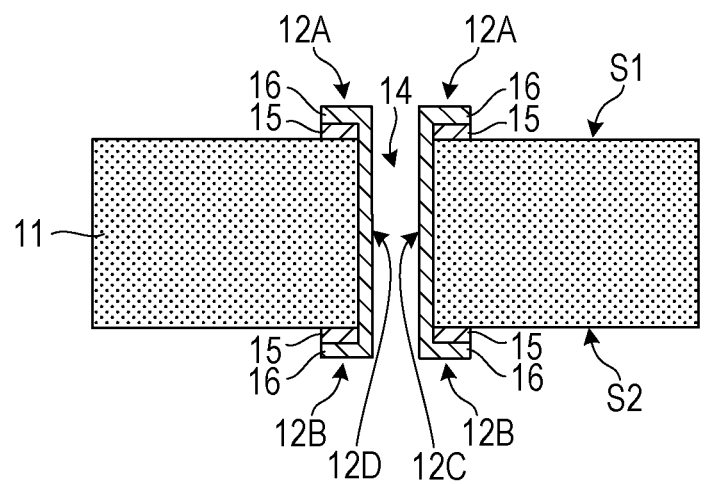
FIG. 4C is a cross-sectional view taken along line IVC-IVC in FIG. 3C.

Next, a wiring pattern is formed using the conductor 12. This process forms a conductor pattern surrounding the outer periphery of the through hole 14. The portions where the plating film 16 and the copper foil 15 are stacked on the first surfaces S1 and S2 of the base plate 11 become the conductor portions 12A and 12B, and the portions where the plating film 16 covers the inner walls of the through hole 14 become the conductor portions 12C and 12D (FIGS. 3C and 4C).

Figure 3D:
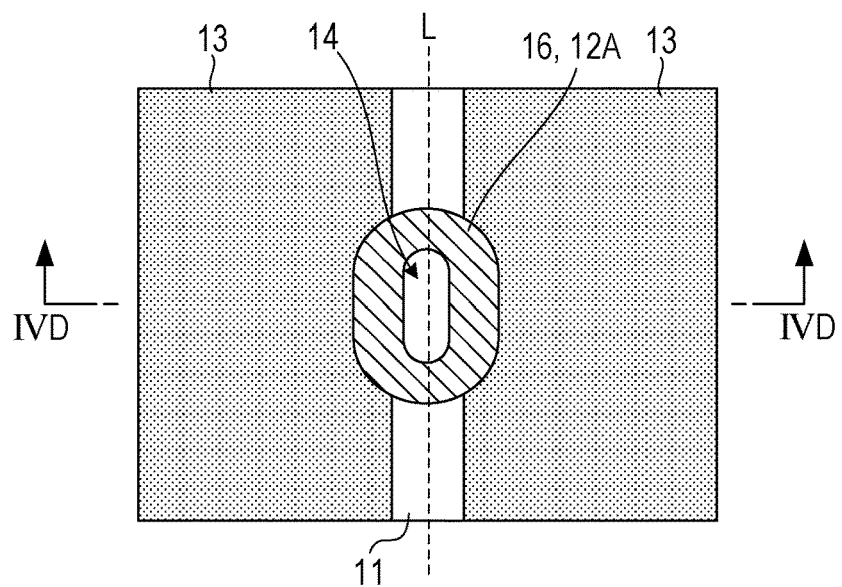
FIG. 3D is a plan view of the example of the method of producing the wiring board according to the embodiment of the disclosed technique.
Figure 4D:
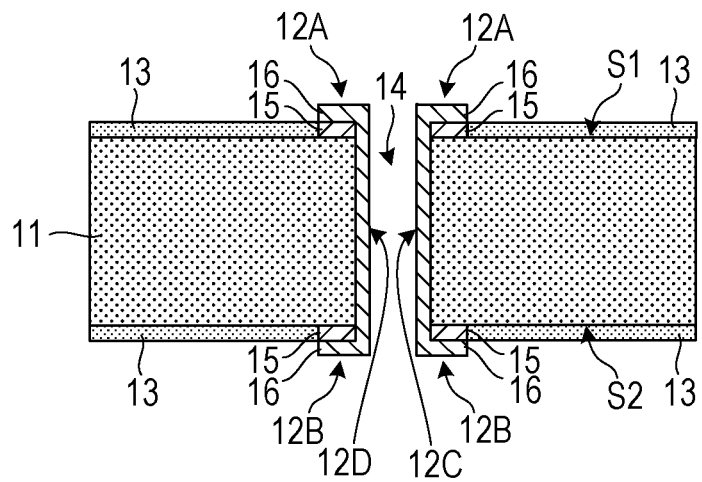
FIG. 4D is a cross-sectional view taken along line IVD-IVD in FIG. 3D.

Next, the solder resist 13 is formed on each of the first surface S1 and second surface S2 of the base plate 11 (FIGS. 3D and 4D).

Figure 3E:
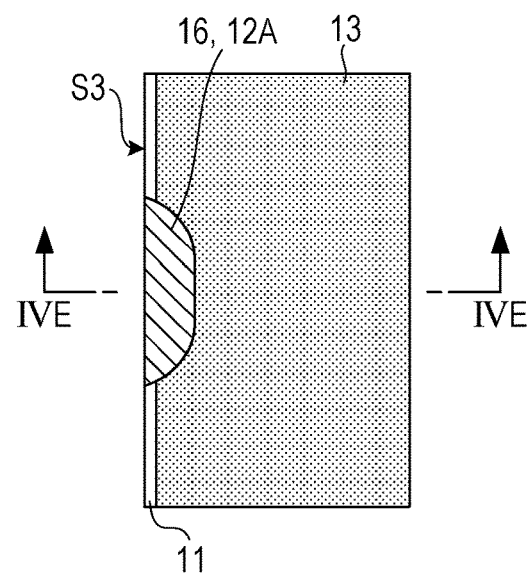
FIG. 3E is a plan view of the example of the method of producing the wiring board according to the embodiment of the disclosed technique.
Figure 4E:
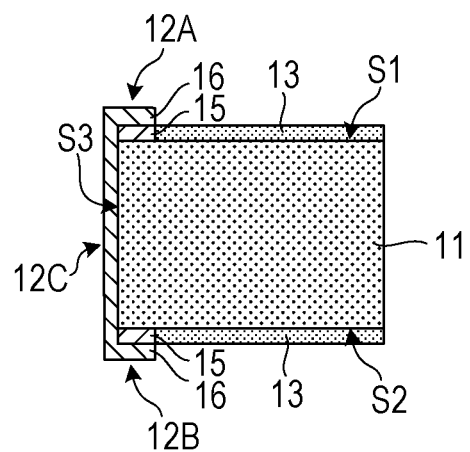
FIG. 4E is a cross-sectional view taken along line IVE-IVE in FIG. 3E.

Next, the base plate 11 is cut along cutting line L (see FIG. 3D) passing through the through hole 14. This process exposes the surface to be the side surface S3 (or the side surface S4) of the base plate 11, and the plating film 16 covering the inner walls of the through hole 14 is exposed (FIGS. 3E and 4E).

Figure 3F:
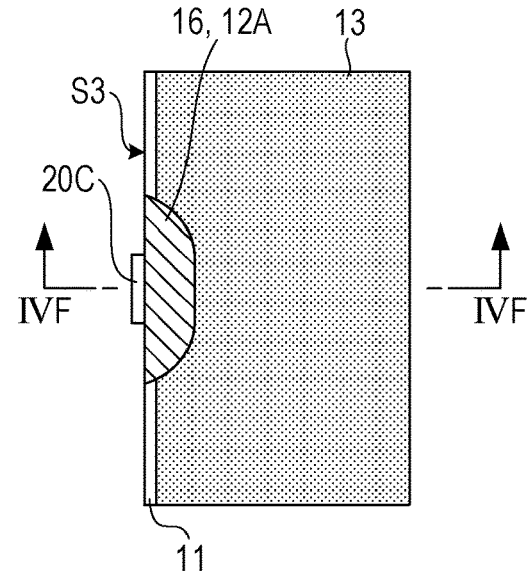
FIG. 3F is a plan view of the example of the method of producing the wiring board according to the embodiment of the disclosed technique.
Figure 4F:
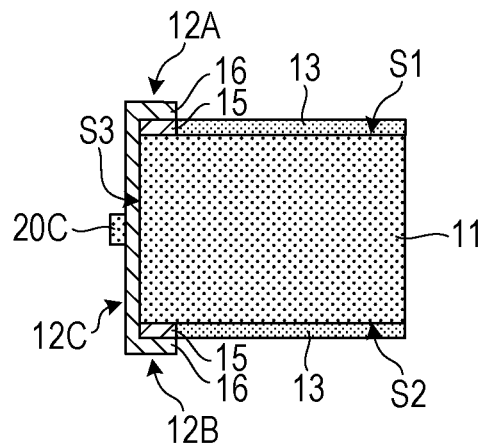
FIG. 4F is a cross-sectional view taken along line IVF-IVF in FIG. 3F.

Next, plastic ink is applied to the surfaces of the plating film 16 (the conductor portions 12C and 12D) covering the side surfaces S3 and S4 of the base plate 11 to form the protrusions 20C and 20D, respectively (FIGS. 3F and 4F). The plastic ink used may be solder resist ink or plastic ink used for drawing letters, symbols, marks, and the like on a wiring board. The plastic ink may be applied by, for example, an inkjet method.

Figure 5:
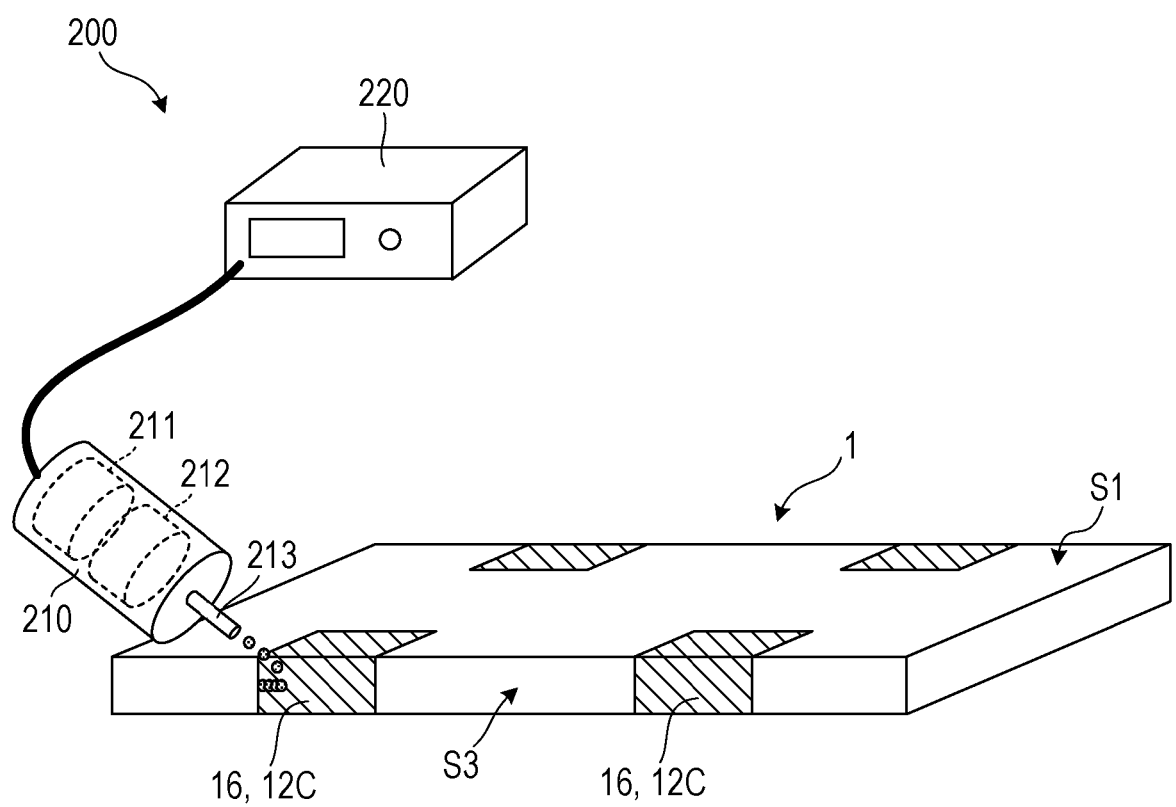
FIG. 5 is a diagram illustrating a method of applying plastic ink to surfaces of plating film using an inkjet apparatus according to the embodiment of the disclosed technique.

FIG. 5 is a diagram illustrating a method of applying the plastic ink to the surface of the plating film 16 (the conductor portions 12C and 12D) using an inkjet apparatus 200. The inkjet apparatus 200 includes an ink ejector 210 having an ink cartridge 211 containing plastic ink and an ejection unit 212 to eject droplets of plastic ink from an ejection port 213 and a control unit 220 to control ejection of ink of the ink ejector 210. Droplets of plastic ink are ejected from the ejection port 213 toward the plating film 16 (the conductor portions 12C or 12D) covering the side surface S3 (or S4) the base plate 11. After droplets of the plastic ink are deposited on the plating film 16, the plastic ink is cured by heat treatment at approximately 100° C. to 150° C. This process forms the protrusions 20C and 20D on the surfaces of the plating films 16.

Figure 6A:
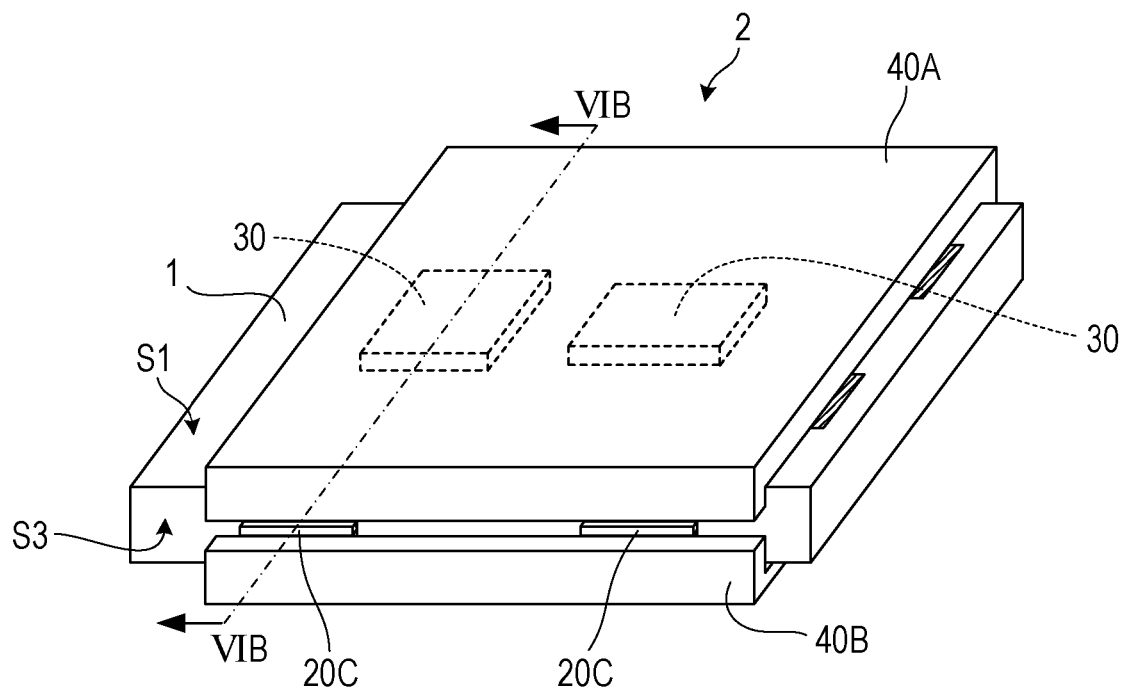
FIG. 6A is a perspective view of the structure of an electronic apparatus according to the embodiment of the disclosed technique.

FIG. 6A is a perspective view of the structure of an electronic apparatus 2 including the wiring board 1, according to a first embodiment of the disclosed technique, and FIG. 6B is a cross-sectional view taken along line VIB-VIB in FIG. 6A. The electronic apparatus 2 includes the wiring board 1, electronic components 30 mounted on the first surface S1 and second surface S2 of the wiring board 1, and shielding sheet metals 40A and 40B. The electronic apparatus 2 may be, for example, a wireless communication terminal, such as a mobile phone and a smartphone, and the electronic components 30 may include, for example, a semiconductor chip including an integrated circuit for wireless communication. The shielding sheet metals 40A and 40B each have two bent portions formed at 90 degrees to be adapted to the shape and dimensions of the wiring board 1.

The shielding sheet metal 40A covers the first surface S1 so as to shield the electronic components 30 mounted on the first surface S1 of the wiring board 1. The shielding sheet metal 40A also covers the areas of the side surfaces S3 and S4 of the wiring board 1 on the first surface S1 side when viewed from the protrusions 20C and 20D. The shielding sheet metal 40A is joined via solder 50 to the conductor portions 12A extending on the first surface S1 of the wiring board 1.

The shielding sheet metal 40A is also joined via the solder 50 to the portions 12C_1, extending on the first surface S1 side when viewed from the protrusions 20C, of the conductor portions 12C extending on the side surface S3 of the wiring board 1. The shielding sheet metal 40A is also joined via the solder 50 to the portions 12D_1, extending on the first surface S1 side when viewed from the protrusions 20D, of the conductor portions 12D extending on the side surface S4 of the wiring board 1.

The shielding sheet metal 40B covers the second surface S2 so as to shield the electronic components 30 mounted on the second surface S2 of the wiring board 1. The shielding sheet metal 40B also covers the areas of the side surfaces S3 and S4 of the wiring board 1 on the second surface S2 side when viewed from the protrusions 20C and 20D. The shielding sheet metal 40B is joined via solder 50 to the conductor portions 12B extending on the second surface S2 of the wiring board 1. The shielding sheet metal 40B is also joined via the solder 50 to the portions 12C_2, extending on the second surface S2 side when viewed from the protrusions 20C, of the conductor portions 12C extending on the side surface S3 of the wiring board 1. The shielding sheet metal 40B is also joined via the solder 50 to the portions 12D_2, extending on the second surface S2 side when viewed from the protrusions 20D, of the conductor portions 12D extending on the side surface S4 of the wiring board 1.

The shielding sheet metals 40A and 40B are coupled to the ground potential via the conductors 12. Covering the wiring board 1 with the shielding sheet metals 40A and 40B reduces interference of electromagnetic waves emitted from the electronic components 30 to radio waves for communication and the occurrence of malfunction of the electronic components 30 due to external electromagnetic waves. Covering not only the first surface S1 and second surface S2 of the wiring board 1 but also the side surfaces S3 and S4 with the shielding sheet metals 40A and 40B increases the effect of shielding electromagnetic waves.

FIGS. 7A to 7E are cross-sectional diagrams illustrating an example of a method of attaching the shielding sheet metals 40A and 40B to the wiring board 1.

Figure 7A:
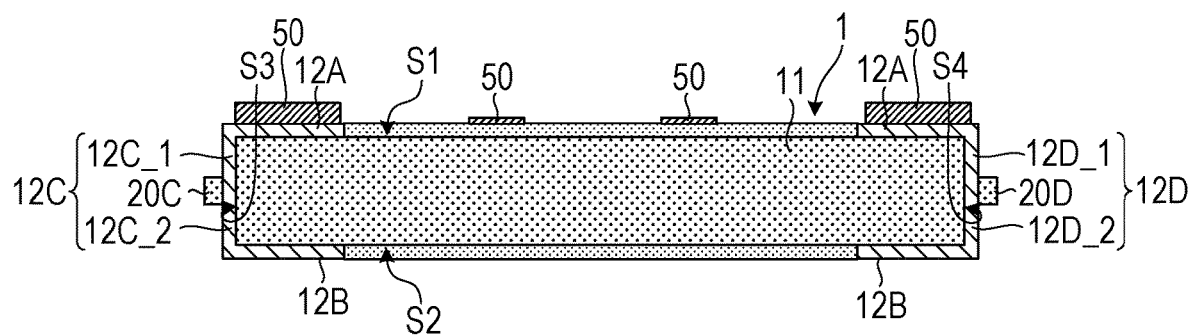
FIG. 7A is a cross-sectional diagram illustrating an example of a method of attaching shielding sheet metals to the wiring board according to the embodiment of the disclosed technique.

First, paste solder 50 is printed on footprints for the electronic components 30 to be mounted on the first surface S1 of the wiring board 1 and the conductor portions 12A extending on the first surface S1 of the wiring board 1 (FIG. 7A).

Figure 7B:
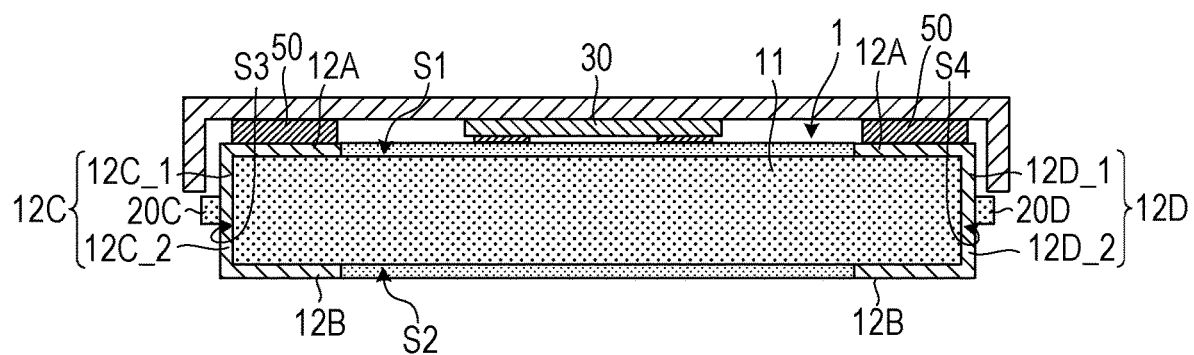
FIG. 7B is a cross-sectional diagram illustrating the example of the method of attaching the shielding sheet metals to the wiring board according to the embodiment of the disclosed technique.

Next, the electronic components 30 and the shielding sheet metal 40A are mounted on the first surface S1 of the wiring board 1. The first surface S1 of the wiring board 1 and the areas of the side surfaces S3 and S4 of the wiring board 1 on the first surface S1 side when viewed from the protrusions 20C and 20D are covered with the shielding sheet metal 40A (FIG. 7B).

Figure 7C:
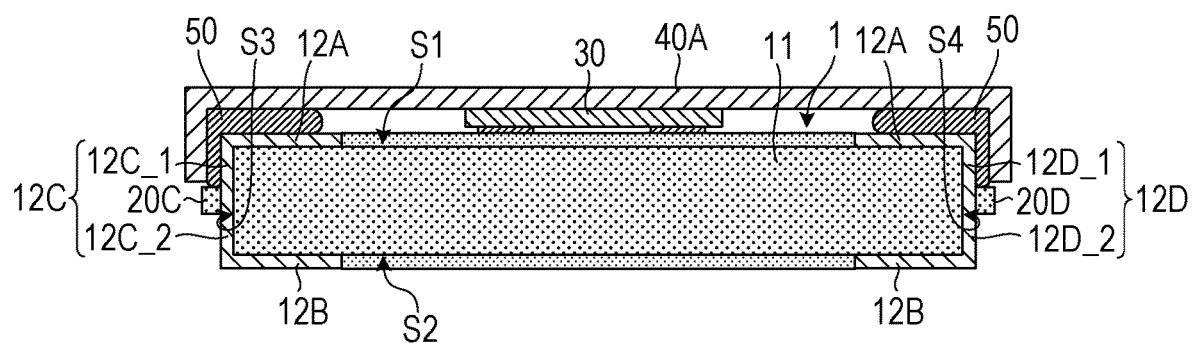
FIG. 7C is a cross-sectional diagram illustrating the example of the method of attaching the shielding sheet metals to the wiring board according to the embodiment of the disclosed technique.

Next, the solder 50 is melted by a reflow process. The shielding sheet metal 40A is soldered to the conductor portions 12A extending on the first surface S1 of the wiring board 1. The shielding sheet metal 40A is also soldered to the portions 12C_1, extending on the first surface S1 side when viewed from the protrusion 20C, of the conductor portions 12C extending on the side surface S3 of the wiring board 1. The shielding sheet metal 40A is also soldered to the portions 12D_1, extending on the first surface S1 side when viewed from the protrusions 20D, of the conductor portions 12D extending on the side surface S4 of the wiring board 1 (FIG. 7C).

The protrusions 20C and 20D having a wettability of the solder 50 lower than the conductors 12 are respectively provided on the surfaces of the conductor portions 12C and 12D. This makes it less likely for the solder 50 to spread over the portions 12C_2 and 12D_2, extending on the second surface S2 side when viewed from the protrusions 20C and 20D, of the conductor portions 12C and 12D.

Figure 7D:
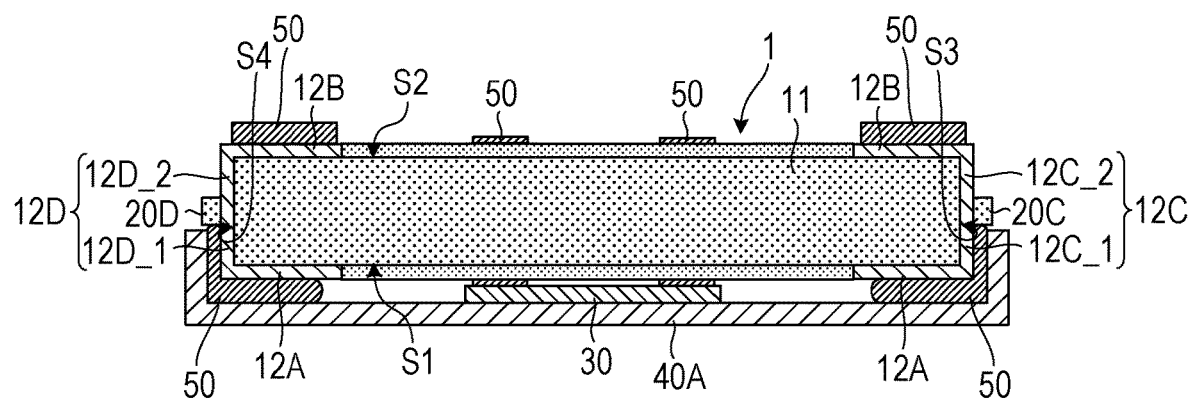
FIG. 7D is a cross-sectional diagram illustrating the example of the method of attaching the shielding sheet metals to the wiring board according to the embodiment of the disclosed technique.

Next, the wiring board 1 is turned by 180 degrees so that the second surface S2 faces up. Then, the paste solder 50 is printed on footprints for the electronic components 30 to be mounted on the second surface S2 of the wiring board 1 and the conductor portions 12B extending on the second surface S2 of the wiring board 1 (FIG. 7D).

Figure 7E:
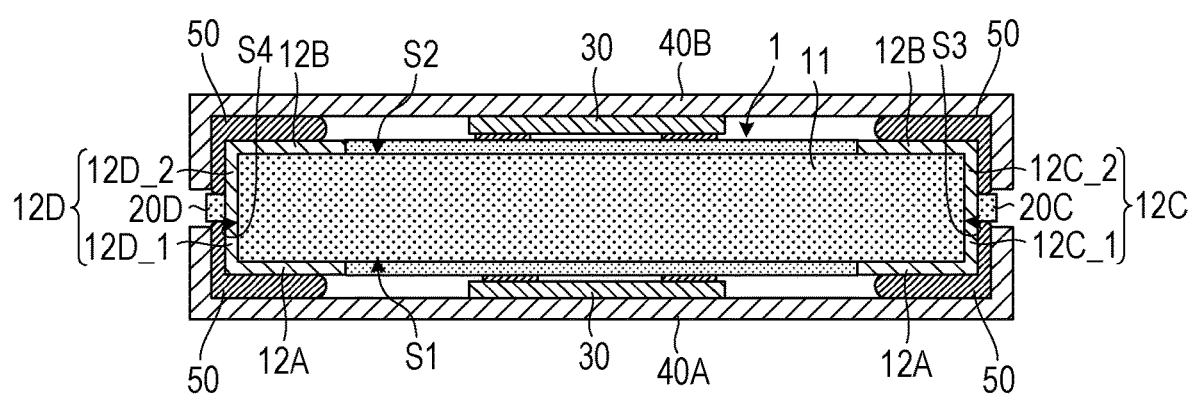
FIG. 7E is a cross-sectional diagram illustrating the example of the method of attaching the shielding sheet metals to the wiring board according to the embodiment of the disclosed technique.

Next, the electronic components 30 and the shielding sheet metal 40B are mounted on the second surface S2 of the wiring board 1. The second surface S2 of the wiring board 1 and the areas of the side surfaces S3 and S4 of the wiring board 1 on the second surface S2 side when viewed from the protrusions 20C and 20D are covered with the shielding sheet metal 40B. As described above, this structure makes it less likely for the solder 50 to spread over the portions 12C_2 and 12D_2, extending on the second surface S2 when viewed from the protrusions 20C and 20D, of the conductor portions 12C and 12D when the shielding sheet metal 40A is attached. This makes it possible to attach the shielding sheet metal 40B to the wiring board 1 without causing interference between the shielding sheet metal 40B and the solder 50 used for attaching the shielding sheet metal 40A. After that, the solder 50 is melt in a reflow process. The shielding sheet metal 40B is soldered to the conductor portions 12B extending on the second surface S2 of the wiring board 1. The shielding sheet metal 40B is also soldered to the portions 12C_2, extending on the second surface S2 side when viewed from the protrusions 20C, of the conductor portions 12C extending on the side surface S3 of the wiring board 1. The shielding sheet metal 40B is also soldered to the portions 12D_2, extending on the second surface S2 side when viewed from the protrusions 20D, of the conductor portions 12D extending on the side surface S4 of the wiring board 1 (FIG. 7E).

Figure 8:
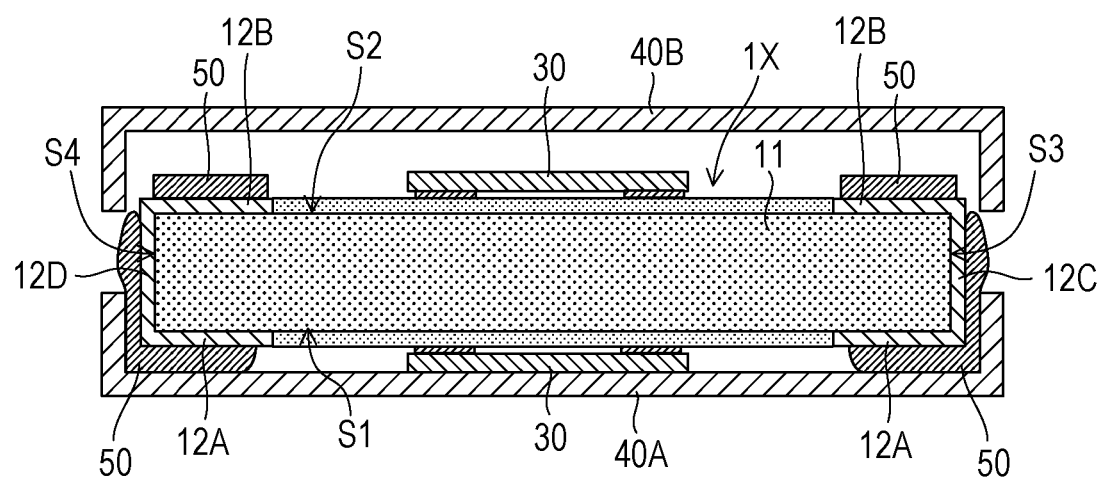
FIG. 8 is a cross-sectional view of a wiring board according to a comparative example and shielding sheet metals when the shielding sheet metals are attached to the wiring board.

FIG. 8 is a cross-sectional view of a wiring board 1X according to a comparative example in which protrusions are not provided on the surfaces of the conductor portions 12C and 12D and the shielding sheet metals 40A and 40B when the shielding sheet metals 40A and 40B are attached to the wiring board 1X. In the wiring board 1X according to the comparative example, solder 50 used for attaching the shielding sheet metal 40A may be wetting and move vertically on the conductor portions 12C and 12D and spread to the positions where the shielding sheet metal 40B is to be attached. In this case, the portions of the shielding sheet metal 40B to cover the side surfaces S3 and S4 interfere with the solder 50 used for attaching the shielding sheet metal 40A, making it difficult to attach the shielding sheet metal 40B to the wiring board 1X.

On the other hand, the wiring board 1 according to the embodiment of the disclosed technique includes the protrusions 20C which partition the conductor portions 12C into the portions 12C_1 extending on the first surface S1 side of the base plate 11 and the portions 12C_2 extending on the second surface S2 side of the base plate 11. The wiring board 1 also has the protrusions 20D which partition the conductor portions 12D into the portions 12D_1 extending on the first surface S1 side of the base plate 11 and the portions 12D_2 extending on the second surface S2 side of the base plate 11. This makes it less likely for the solder 50 to spread over the portions 12C_2 and 12D_2 extending on the second surface S2 side when viewed from the protrusions 20C and 20D when the shielding sheet metal 40A is attached to the wiring board 1. Accordingly, this makes less likely the occurrence of the interference between the shielding sheet metal 40B and the solder 50, making it easy to attach the shielding sheet metal 40B to the wiring board 1.

Second Embodiment

Figure 9:
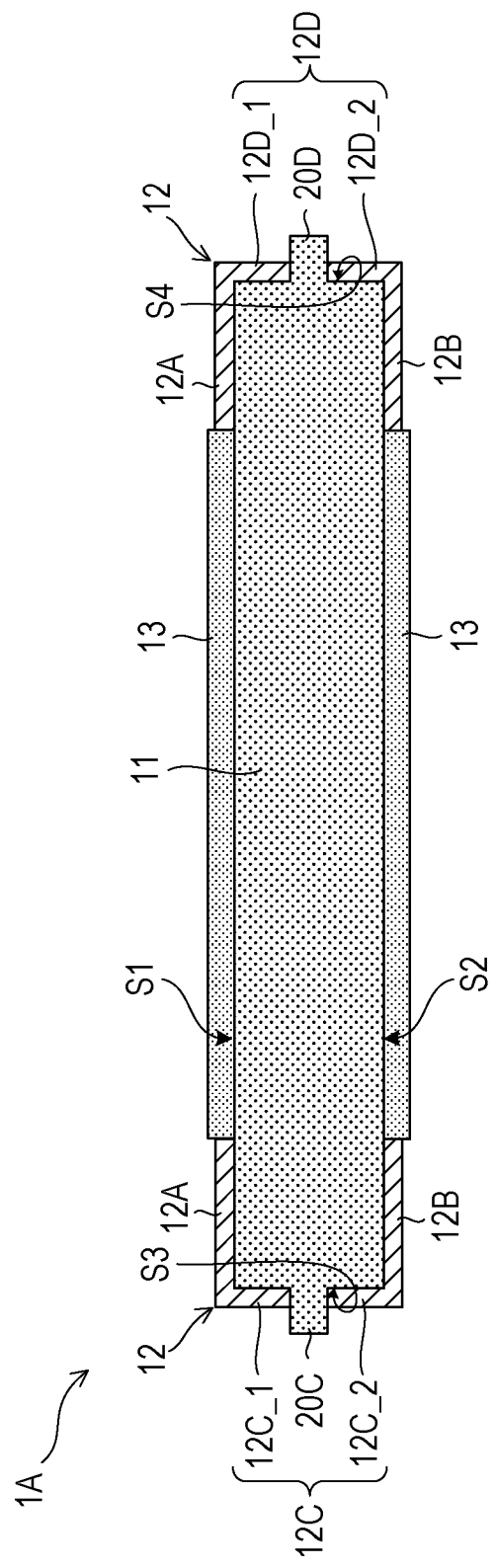
FIG. 9 is a cross-sectional view of the structure of a wiring board according to a second embodiment of the disclosed technique.

FIG. 9 is a cross-sectional view of the structure of a wiring board 1A according to a second embodiment of the disclosed technique. The section illustrated in FIG. 9 corresponds to the section illustrated in FIG. 1B. The wiring board 1A is different from the wiring board 1 according to the first embodiment (see FIG. 1B) in that protrusions 20C and 20D in the wiring board 1A are formed by portions protruding from the side surfaces S3 and S4 of the base plate 11 and that conductor portions 12C and 12D are separated by the protrusions 20C and 20D.

In other words, in the wiring board 1A, each conductor portion 12C extending on the side surface S3 of the base plate 11 is separated by the protrusion 20C into a portion 12C_1 extending on the first surface S1 side of the base plate 11 and a portion 12C_2 extending on the second surface S2 side of the base plate 11. In the same manner, each conductor portion 12D extending on the side surface S4 of the base plate 11 is separated by the protrusion 20D into a portion 12D_1 extending on the first surface S1 side of the base plate 11 and a portion 12D_2 extending on the second surface S2 side of the base plate 11. The protrusions 20C and 20D may be made of the same material as the base plate 11.

FIGS. 10A, 10B, 10C, 10D, and 10E are plan views illustrating an example of a method of producing the wiring board 1A. FIGS. 11A, 11B, 11C, 11D, and 11E are cross-sectional views respectively taken along lines XIA-XIA, XIB-XIB, XIC-XIC, XID-XID, and XIE-XIE in FIGS. 10A to 10E.

Figure 10A:
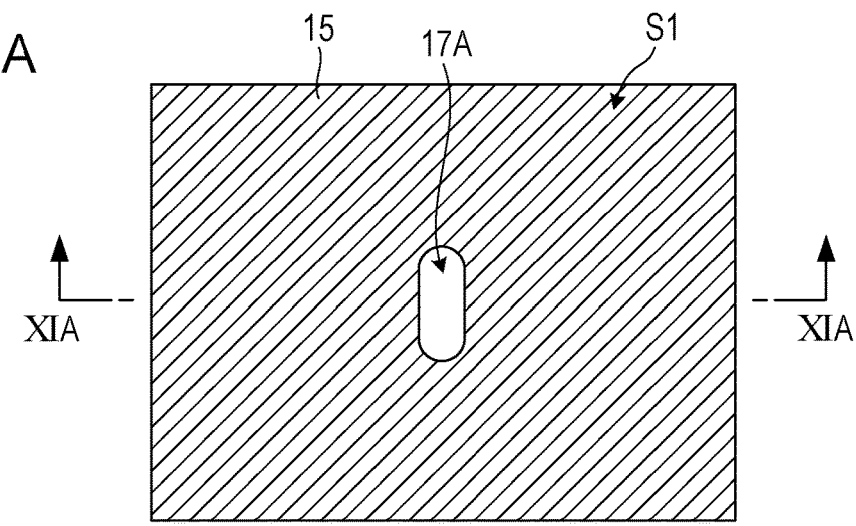
FIG. 10A is a plan view of an example of a method of producing the wiring board according to the second embodiment of the disclosed technique.
Figure 11A:
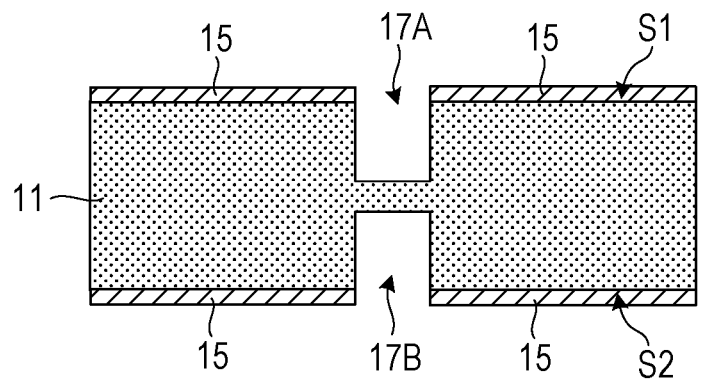
FIG. 11A is a cross-sectional view taken along line XIA-XIA in FIG. 10A.

First, copper foil 15 is attached to the first surface S1 and second surface S2 of a base plate 11 composed of an insulator, such as glass epoxy resin. Next, a recess 17A recessed from the first surface S1 of the base plate 11 toward the second surface S2 is formed. Then, a recess 17B recessed from the second surface S2 of the base plate 11 toward the first surface S1 is formed at the position corresponding to the recess 17A (FIGS. 10A and 11A).

Figure 10B:
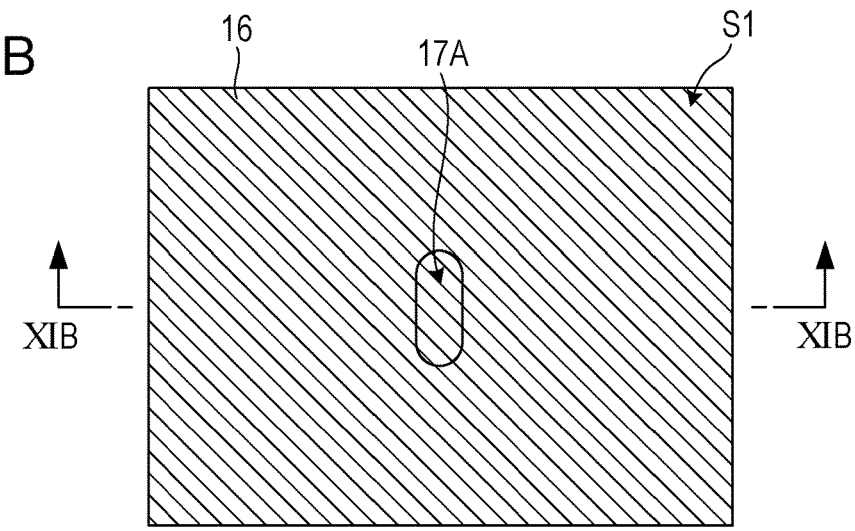
FIG. 10B is a plan view of the example of the method of producing the wiring board according to the second embodiment of the disclosed technique.
Figure 11B:
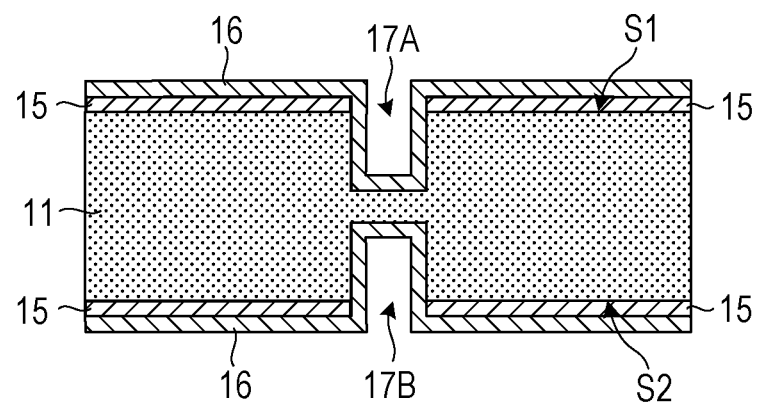
FIG. 11B is a cross-sectional view taken along line XIB-XIB in FIG. 10B.

Next, plating film 16 is formed on the surfaces of the copper foil 15 and the inner walls of the recesses 17A and 17B, using a plating method. The material of the plating film 16 may be copper (FIGS. 10B and 11B).

Figure 10C:
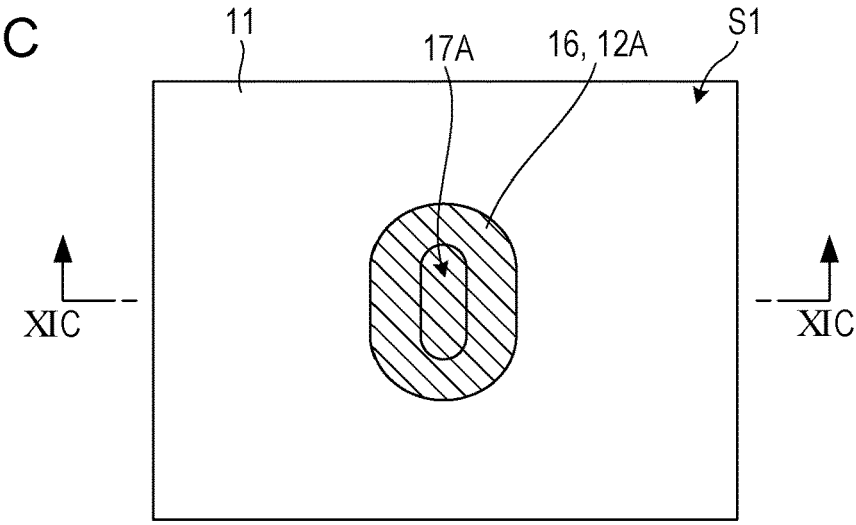
FIG. 10C is a plan view of the example of the method of producing the wiring board according to the second embodiment of the disclosed technique.
Figure 11C:
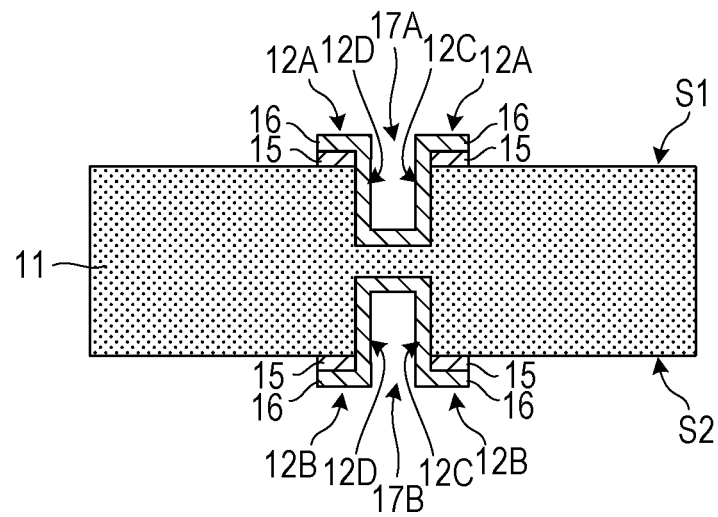
FIG. 11C is a cross-sectional view taken along line XIC-XIC in FIG. 10C.

Next, a wiring pattern is formed using the conductor 12. This process forms conductor patterns surrounding the outer peripheries of the recesses 17A and 17B. The portions where the plating film 16 and the copper foil 15 are stacked on the first surfaces S1 and S2 of the base plate 11 become conductor portions 12A and 12B, and the portions where the plating film 16 covers the inner walls of the recesses 17A and 17B become the conductor portions 12C and 12D (FIGS. 10C and 11C).

Figure 10D:
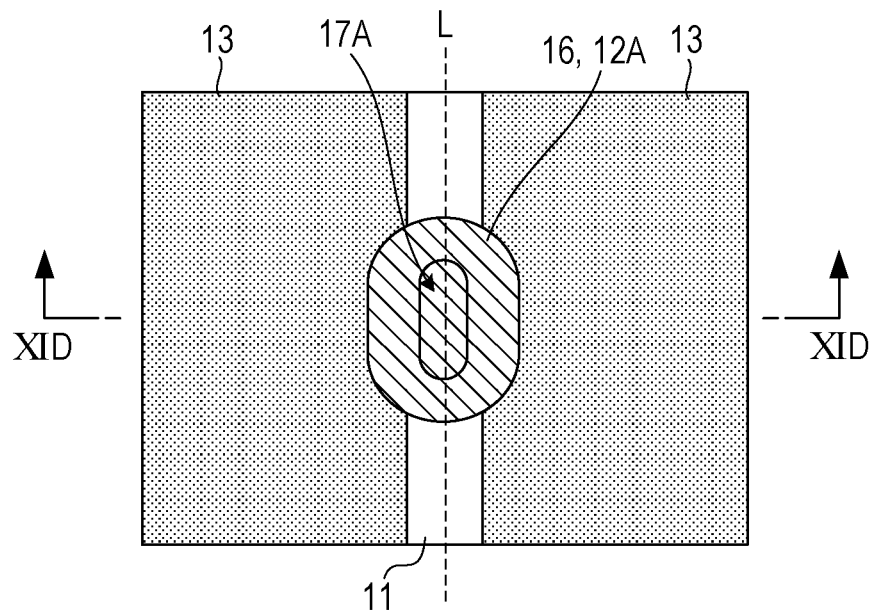
FIG. 10D is a plan view of the example of the method of producing the wiring board according to the second embodiment of the disclosed technique.
Figure 11D:
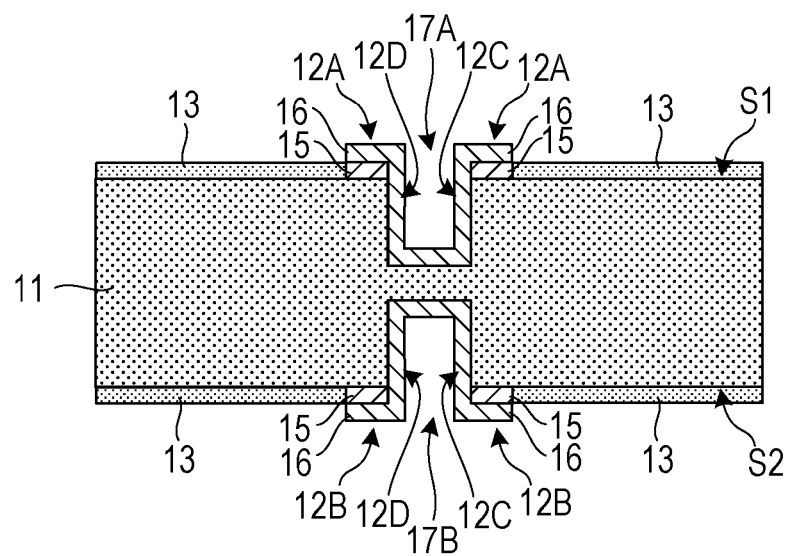
FIG. 11D is a cross-sectional view taken along line XID-XID in FIG. 10D.

Next, solder resist 13 is formed on each of the first surface S1 and second surface S2 of the base plate 11 (FIGS. 10D and 11D).

Figure 10E:
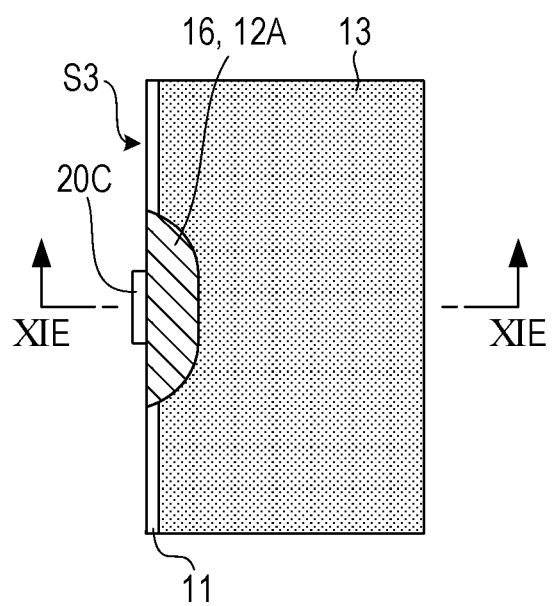
FIG. 10E is a plan view of the example of the method of producing the wiring board according to the second embodiment of the disclosed technique.
Figure 11E:
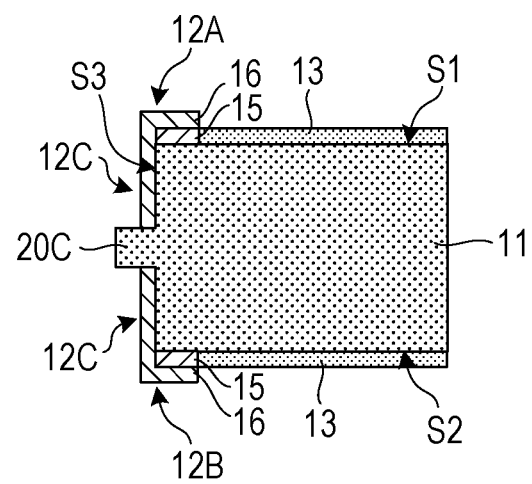
FIG. 11E is a cross-sectional view taken along line XIE-XIE in FIG. 10E.

Next, the base plate 11 is cut along cutting line L (see FIG. 10D) passing through the recesses 17A and 17B. This process exposes the surface to be the side surface S3 (or the side surface S4) of the base plate 11, and the plating film 16 covering the inner walls of the recesses 17A and 17B is exposed. A portion of the base plate 11 between the bottom surface of the recess 17A and the bottom surface of the recess 17B forms the protrusion 20C (or the protrusion 20D) (FIGS. 10E and 11E).

Figure 12A:
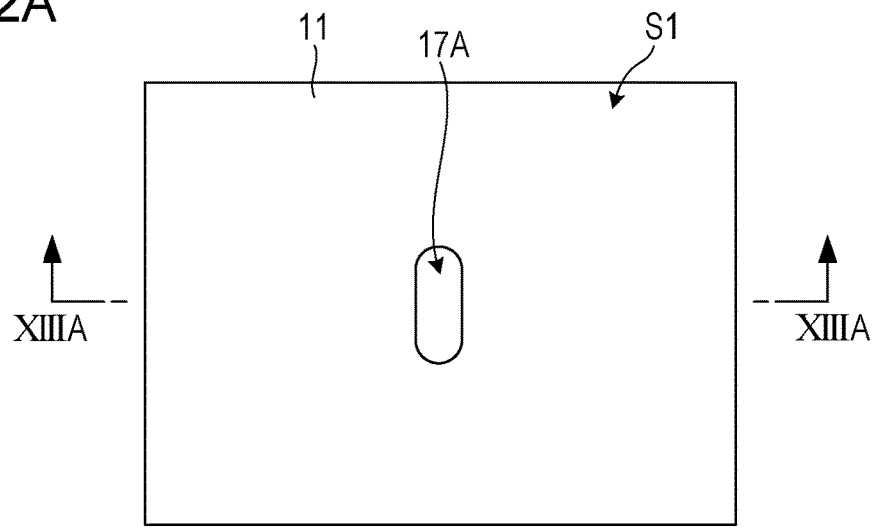
FIG. 12A is a plan view of an example of a method of producing a wiring board according to the second embodiment of the disclosed technique.
Figure 12B:
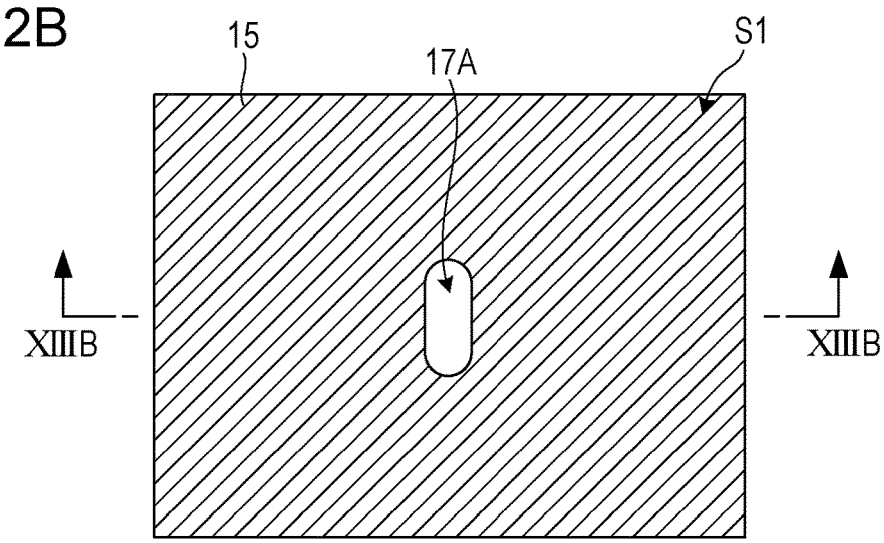
FIG. 12B is a plan view of the example of the method of producing the wiring board according to the second embodiment of the disclosed technique.
Figure 12C:
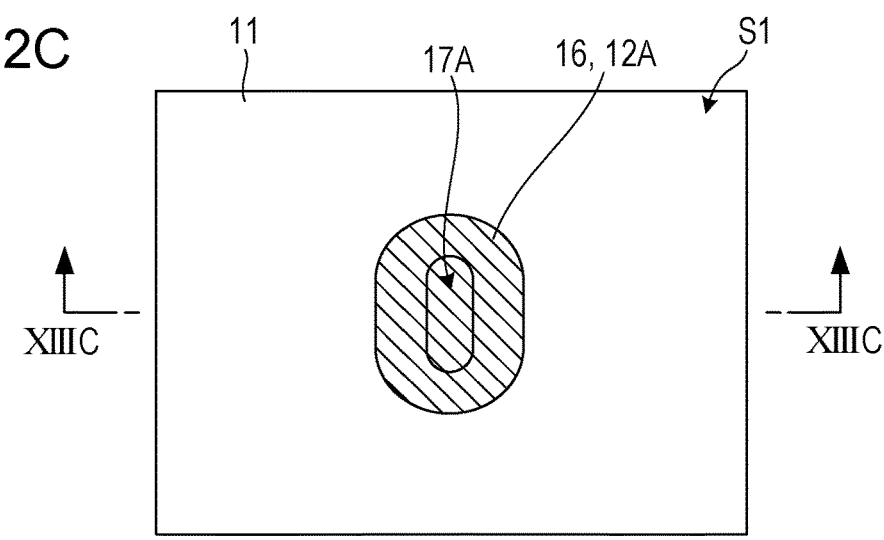
FIG. 12C is a plan view of the example of the method of producing the wiring board according to the second embodiment of the disclosed technique.

FIGS. 12A, 12B, 12C, 12D, and 12E are plan views illustrating another example of a method of producing the wiring board 1A. FIGS. 13A, 13B, 13C, 13D, and 13E are cross-sectional views respectively taken along lines XIIIA-XIIIA, XIIIB-XIIIB, XIIIC-XIIIC, XIIID-XIIID, and XIIIE-XIIIE in FIGS. 12A to 12E. FIG. 14 is a plan view of a build-up material 11b used for the base plate 11.

As illustrated in FIG. 14, the build-up material 11b has a through hole 18 formed in advance. The build-up material 11b may be made of pre-preg. Multiple build-up materials 11b each having the through hole 18 are stacked on both sides of a core material 11a which is a material for the base plate 11 such that the positions of the through holes 18 are aligned. This process forms a base plate 11 having a recess 17A recessed from the first surface S1 toward the second surface S2 and a recess 17B from the second surface S2 toward the first surface S1 is formed (FIGS. 12A and 13A).

Next, copper foil 15 is attached to the first surface S1 and second surface S2 of the base plate 11, and the copper foil 15 of the portions where the recesses 17A and 17B (the through holes 18) are formed is removed. This process exposes the inner walls of the recesses 17A and 17B (FIGS. 12B and 13B).

Next, plating film 16 is formed on the surfaces of the copper foil 15 and the inner walls of the recesses 17A and 17B (the through holes 18), using a plating method. The material of the plating film 16 may be copper. After that, a wiring pattern is formed using the conductor 12. This process forms conductor patterns surrounding the outer peripheries of the recesses 17A and 17B. The portions where the plating film 16 and the copper foil 15 are stacked in the first surfaces S1 and S2 of the base plate 11 become the conductor portions 12A and 12B, and the portions where the plating film 16 covers the inner walls of the recesses 17A and 17B become the conductor portions 12C and 12D (FIGS. 12C and 13C).

Figure 12D:
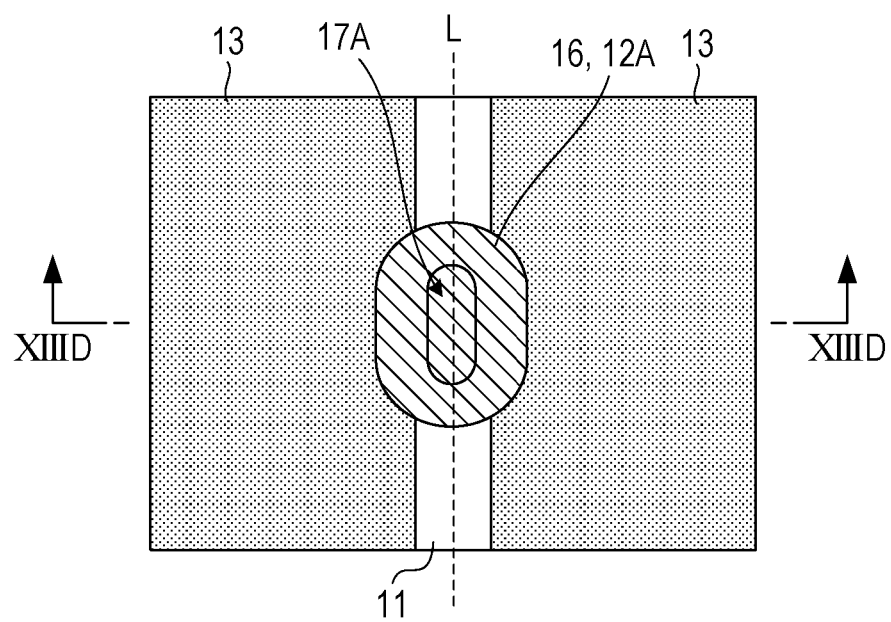
FIG. 12D is a plan view of the example of the method of producing the wiring board according to the second embodiment of the disclosed technique.
Figure 13A:
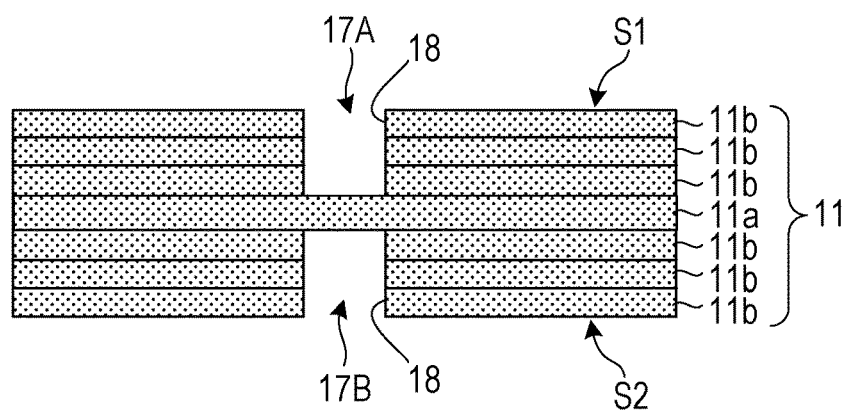
FIG. 13A is a cross-sectional view taken along line XIIIA-XIIIA in FIG. 12A.
Figure 13B:
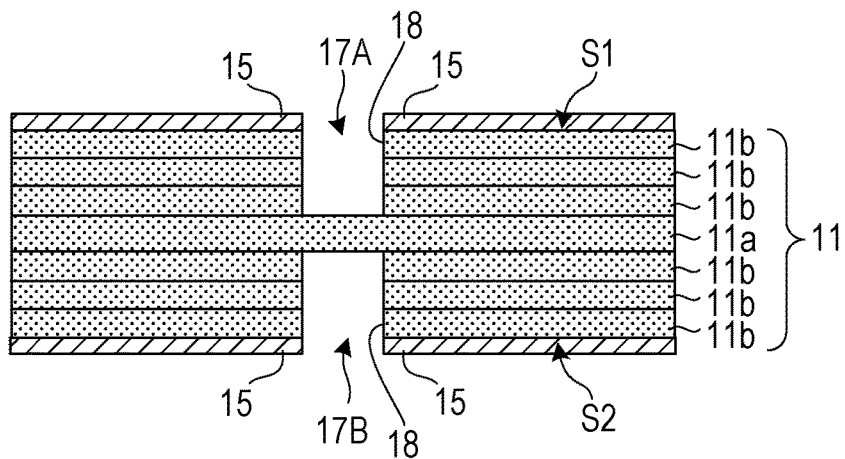
FIG. 13B is a cross-sectional view taken along line XIIIB-XIIIB in FIG. 12B.
Figure 13C:
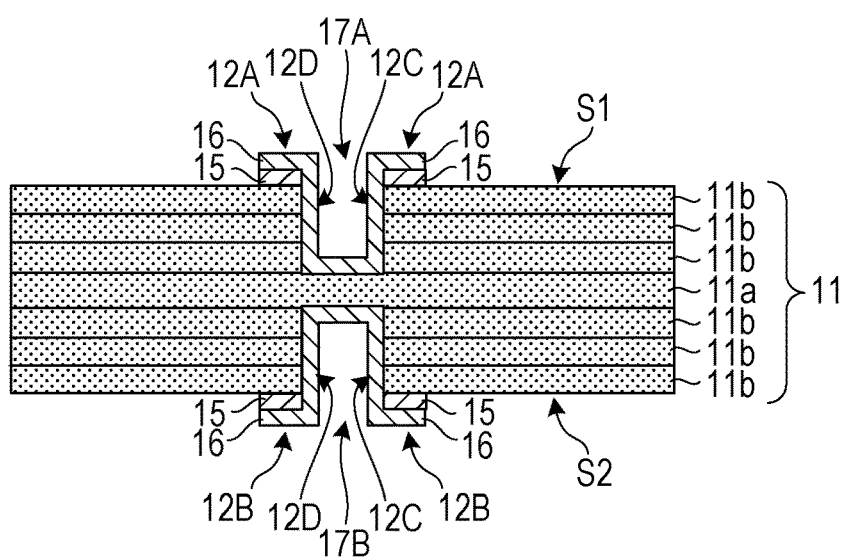
FIG. 13C is a cross-sectional view taken along line XIIIC-XIIIC in FIG. 12C.
Figure 13D:
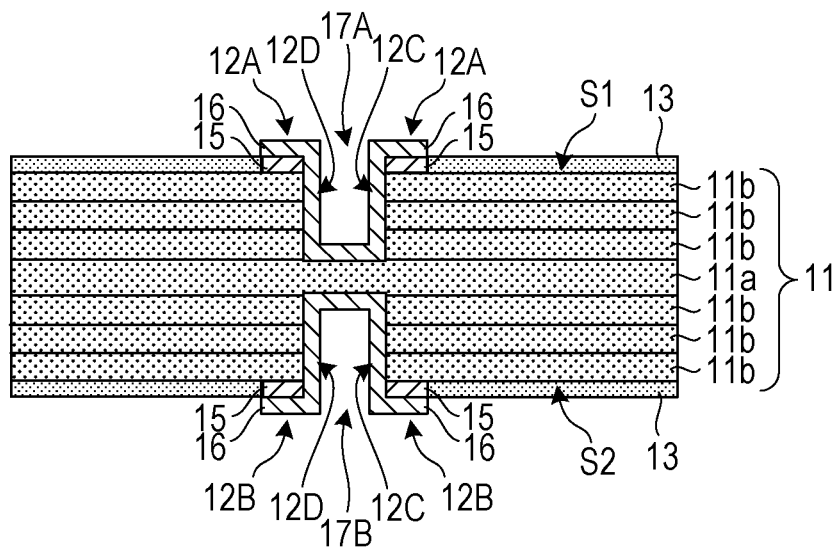
FIG. 13D is a cross-sectional view taken along line XIIID-XIIID in FIG. 12D.
Figure 14:
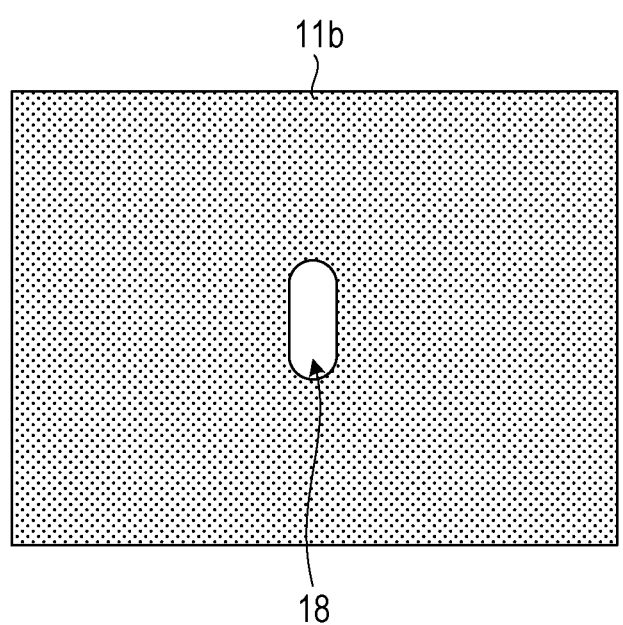
FIG. 14 is a plan view of the structure of a build-up material 11b according to the second embodiment of the disclosed technique.

Next, solder resist 13 is formed on each of the first surface S1 and second surface S2 of the base plate 11 (FIGS. 12D and 13D).

Figure 12E:
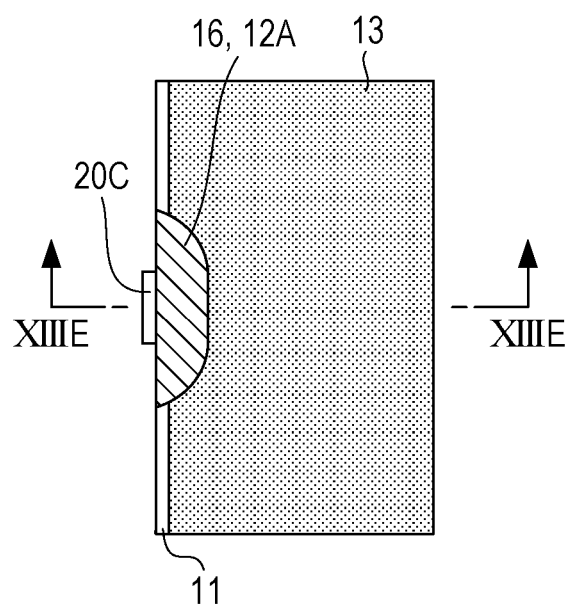
FIG. 12E is a plan view of the example of the method of producing the wiring board according to the second embodiment of the disclosed technique.
Figure 13E:
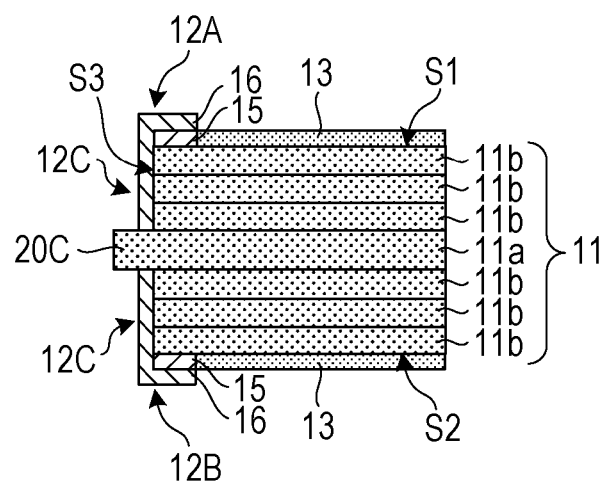
FIG. 13E is a cross-sectional view taken along line XIIIE-XIIIE in FIG. 12E.

Next, the base plate 11 is cut along cutting line L (see FIG. 12D) passing through the recesses 17A and 17B (the through holes 18). This process exposes the surface to be the side surface S3 (or the side surface S4) of the base plate 11, and the plating film 16 covering the inner walls of the recesses 17A and 17B (the through holes 18) is exposed. A portion of the base plate 11 between the bottom surface of the recess 17A and the bottom surface of the recess 17B (in other words, the core material 11a) forms the protrusion 20C (or the protrusion 20D) (FIGS. 12E and 13E).

Figure 15:
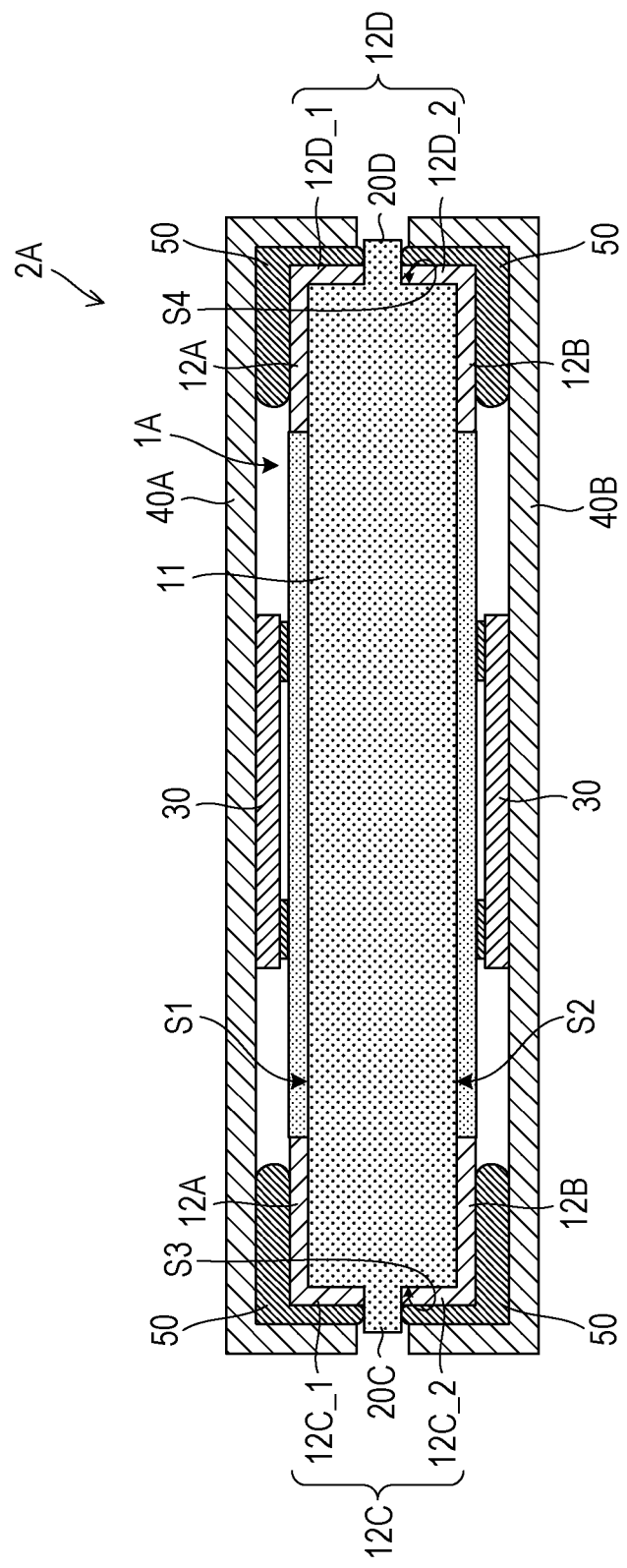
FIG. 15 is a cross-sectional view of the structure of an electronic apparatus according to the second embodiment of the disclosed technique.

FIG. 15 is a cross-sectional view of an electronic apparatus 2A including the wiring board 1A, according to the second embodiment of the disclosed technique. The section illustrated in FIG. 15 corresponds to the section illustrated in FIG. 6B. The electronic apparatus 2A, in the same manner as in the electronic apparatus 2 according to the first embodiment (see FIG. 6B), includes the wiring board 1A, electronic components 30 mounted on the first surface S1 and second surface S2 of the wiring board 1A, and the shielding sheet metals 40A and 40B.

The shielding sheet metal 40A covers the first surface S1 so as to shield the electronic components 30 mounted on the first surface S1 of the wiring board 1A. The shielding sheet metal 40A also covers the areas of the side surfaces S3 and S4 of the wiring board 1A on the first surface S1 side when viewed from the protrusions 20C and 20D. The shielding sheet metal 40A is joined via solder 50 to the conductor portions 12A extending on the first surface S1 of the wiring board 1A. The shielding sheet metal 40A is also joined via the solder 50 to the portions 12C_1, extending on the first surface S1 side when viewed from the protrusions 20C, of the conductor portions 12C extending on the side surface S3 of the wiring board 1A. The shielding sheet metal 40A is also joined via the solder 50 to the portions 12D_1, extending on the first surface S1 side when viewed from the protrusions 20D, of the conductor portions 12D extending on the side surface S4 of the wiring board 1A.

The shielding sheet metal 40B covers the second surface S2 so as to shield the electronic components 30 mounted on the second surface S2 of the wiring board 1A. The shielding sheet metal 40B also covers the areas of the side surfaces S3 and S4 of the wiring board 1A on the second surface S2 side when viewed from the protrusions 20C and 20D. The shielding sheet metal 40B is joined via solder 50 to the conductor portions 12B extending on the second surface S2 of the wiring board 1A. The shielding sheet metal 40B is also joined via the solder 50 to the portions 12C_2, extending on the second surface S2 side when viewed from the protrusions 20C, of the conductor portions 12C extending on the side surface S3 of the wiring board 1A. The shielding sheet metal 40B is also joined via the solder 50 to the portions 12D_2, extending on the second surface S2 side when viewed from the protrusions 20D, of the conductor portions 12D extending on the side surface S4 of the wiring board 1A.

The shielding sheet metals 40A and 40B are coupled to the ground potential via the conductors 12. Covering the wiring board 1A with the shielding sheet metals 40A and 40B reduces interference of electromagnetic waves emitted from the electronic components 30 to radio waves for communication and the occurrence of malfunction of the electronic components 30 due to external electromagnetic waves. Covering not only the first surface S1 and second surface S2 of the wiring board 1A but also the side surfaces S3 and S4 of the wiring board 1A with the shielding sheet metals 40A and 40B increases the effect of shielding electromagnetic waves.

Since the method of attaching the shielding sheet metals 40A and 40B to the wiring board 1A is the same as the method of attaching the shielding sheet metals 40A and 40B to the wiring board 1 according to the first embodiment, description thereof is omitted.

The wiring board 1A according to the second embodiment of the disclosed technique includes the protrusions 20C which separate the conductor portions 12C into the portions 12C_1 extending on the first surface S1 side of the base plate 11 and the portions 12C_2 extending on the second surface S2 side of the base plate 11. The wiring board 1A also has the protrusions 20D which separate the conductor portions 12D into the portions 12D_1 extending on the first surface S1 side of the base plate 11 and the portions 12D_2 extending on the second surface S2 side of the base plate 11. This makes it less likely for the solder 50 to spread over the portions 12C_2 and 12D_2 extending on the second surface S2 side when viewed from the protrusions 20C and 20D when the shielding sheet metal 40A is attached to the wiring board 1A. Accordingly, this makes less likely the occurrence of the interference between the shielding sheet metal 40B and the solder 50, making it easy to attach the shielding sheet metal 40B to the wiring board 1A.

Note that the wiring boards 1 and 1A are examples of wiring boards in the disclosed technique. The base plate 11 is an example of a base plate according to the disclosed technique. The conductor portions 12C and 12D are examples of conductors in the disclosed technique. The protrusions 20C and 20D are examples of protrusions in the disclosed technique. The electronic apparatuses 2 and 2A are examples of electronic apparatuses in the disclosed technique. The electronic components 30 are examples of electronic components in the disclosed technique. The shielding sheet metals 40A and 40B are examples of sheet metal covers in the disclosed technique.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A wiring board comprising:
   a base plate that has a first surface, a second surface opposite to the first surface, and a side surface coupled to the first surface and the second surface;
   a conductor provided on the side surface; and
   a protrusion provided over the side surface,
   wherein the protrusion partitions the conductor into a first portion on the side surface that extends to the first surface and a second portion on the side surface that extends to the second surface,
   the protrusion has a solder wettability lower than the conductor, and
   the protrusion protrudes from the conductor.

2. The wiring board according to claim 1, wherein the conductor includes:
   a portion extending on the first surface and coupled to the first portion, and
   a portion extending on the second surface and coupled to the second portion.

3. The wiring board according to claim 1, wherein the protrusion is made of plastic ink.

4. The wiring board according to claim 1, wherein the protrusion is made of the same material as a material of the base plate.

5. The wiring board according to claim 1, wherein the protrusion physically separates the first portion of the conductor and the second portion of the conductor.

6. An electronic apparatus comprising:
   a wiring board including:
      a base plate that has a first surface, a second surface opposite to the first surface, and a side surface coupled to the first surface and the second surface,
      a conductor provided on the side surface, and
      a protrusion provided over the side surface,
   wherein the protrusion partitions the conductor into a first portion on the side surface that extends to the first surface and a second portion on the side surface that extends to the second surface,
      the protrusion has a solder wettability lower than the conductor, and
      the protrusion protrudes from the conductor;
   electronic components provided on the first surface and the second surface;
   a first sheet metal cover that covers the first surface and an area of the side surface on the first surface side when viewed from the protrusion and is soldered to the first portion of the conductor; and
   a second sheet metal cover that covers the second surface and an area of the side surface on the second surface side when viewed from the protrusion and is soldered to the second portion of the conductor.

7. The electronic apparatus according to claim 6, wherein the protrusion partitions the conductor to provide separation between solder used to connect the first sheet metal and the first portion of the conductor and solder used to connect the second sheet metal and the second portion of the conductor.

8. The electronic apparatus according to claim 6, wherein the conductor includes
   a portion extending on the first surface and coupled to the first portion, and
   a portion extending on the second surface and coupled to the second portion.

9. The electronic apparatus according to claim 6, wherein the protrusion is made of plastic ink.

10. The electronic apparatus according to claim 6, wherein the protrusion is made of the same material as a material of the base plate.

11. A method for attaching sheet metal covers to a wiring board including a base plate that has a first surface, a second surface opposite to the first surface, and a side surface coupled to the first surface and the second surface, and a conductor provided on the side surface, the sheet metal covers being configured to cover the first surface, the second surface, and the side surface, the method comprising:
  providing a protrusion that partitions the conductor into a first portion on the side surface that extends to the first surface and a second portion on the side surface that extends to the second surface, has a solder wettability lower than the conductor, and protrudes from the conductor;
  soldering a first sheet metal cover that covers the first surface and an area of the side surface on the first surface side when viewed from the protrusion, to the first portion of the conductor; and
  soldering a second sheet metal cover that covers the second surface and an area of the side surface on the second surface side when viewed from the protrusion, to the second portion of the conductor.

12. A method for manufacturing a wiring board including a base plate that has a first surface, a second surface opposite to the first surface, and a side surface coupled to the first surface and the second surface, and a conductor provided on the side surface, the method comprising:
  forming a through hole to pass through between the first surface and the second surface of the base plate;
  forming a conductor on an inner wall of the through hole;
  cutting the base plate along cutting line passing through the through hole;
  forming a protrusion that partitions the conductor into a first portion on the side surface that extends to the first surface and a second portion on the side surface that extends to the second surface, the protrusion having a solder wettability lower than the conductor, and protrudes from the conductor.

13. The method for manufacturing a wiring board according to claim 12,
  the forming a protrusion is applying a plastic ink on the conductor.

* * * * *